US008996936B2

(12) United States Patent
Sevugapandian

(10) Patent No.: US 8,996,936 B2
(45) Date of Patent: Mar. 31, 2015

(54) ENHANCED ERROR CORRECTION IN MEMORY DEVICES

(75) Inventor: Saravanakumar Sevugapandian, Milpitas, CA (US)

(73) Assignee: Sandisk Technologies Inc., Plano, TX (US)

( * ) Notice: Subject to any disclaimer, the term of this patent is extended or adjusted under 35 U.S.C. 154(b) by 353 days.

(21) Appl. No.: 13/356,404

(22) Filed: Jan. 23, 2012

(65) Prior Publication Data

US 2013/0151912 A1 Jun. 13, 2013

(30) Foreign Application Priority Data

Dec. 8, 2011 (IN) .......................... 3445/MUM/2011

(51) Int. Cl.
*G11C 29/00* (2006.01)
*G06F 11/00* (2006.01)
(Continued)

(52) U.S. Cl.
CPC .......... *G06F 11/1016* (2013.01); *G06F 11/076* (2013.01); *G06F 11/1072* (2013.01); *G06F 11/0766* (2013.01); *G06F 11/1008* (2013.01); *G06F 11/1068* (2013.01); *G06F 11/1048* (2013.01); *G06F 11/006* (2013.01); *G11C 29/12* (2013.01); *G11C 29/04* (2013.01); *G11C 29/20* (2013.01); *G11C 29/56008* (2013.01); *G11C 29/52* (2013.01); *G11C 29/44* (2013.01); *G01R 31/3193* (2013.01)
USPC ........... 714/723; 714/704; 714/718; 714/719; 714/735; 714/736; 714/763; 714/766; 714/773; 714/6.1; 714/6.13; 365/200; 365/201

(58) Field of Classification Search
CPC .............. G06F 11/1072; G06F 11/076; G06F 11/0766; G06F 11/006; G06F 11/1016; G06F 11/1048; G06F 11/1008; G06F 11/1068; G11C 29/04; G11C 29/12; G11C 29/20; G11C 29/44; G11C 29/52; G11C 29/56008; G01R 31/3193
USPC ......... 714/723, 704, 718, 719, 735, 736, 763, 714/766, 773, 6.1, 6.13; 365/200, 201
See application file for complete search history.

(56) References Cited

U.S. PATENT DOCUMENTS 4,209,846 A 6/1980 Seppa
5,603,001 A * 2/1997 Sukegawa et al. ............ 711/103
(Continued)

OTHER PUBLICATIONS

The International Search Report and Written Opinion of the International Searching Authority mailed Jul. 26, 2013 in International Application No. PCT/US2012/064423, 16 pages.
(Continued)

*Primary Examiner* — John T Tabone, Jr.
(74) *Attorney, Agent, or Firm* — Toler Law Group, PC

(57) ABSTRACT

A method of correcting stored data includes reading data stored in a portion of a nonvolatile memory. The method includes, for each particular bit position of the read data, updating a count of data error instances associated with the particular bit position in response to detecting that the read data differs from a corresponding reference value of the particular bit position. The reading of the first portion and the updating of the counts of data error instances are performed for a particular number of repetitions. The method includes identifying each bit position having an associated count of data error instances equal to the particular number of repetitions as a recurring error bit position.

31 Claims, 5 Drawing Sheets

(51) Int. Cl.
    *G01R 31/28*     (2006.01)
    *G06F 11/10*     (2006.01)
    *G06F 11/07*     (2006.01)
    *G11C 29/12*     (2006.01)
    *G11C 29/04*     (2006.01)
    *G11C 29/20*     (2006.01)
    *G11C 29/56*     (2006.01)
    *G11C 29/52*     (2006.01)
    *G11C 29/44*     (2006.01)
    *G01R 31/3193*     (2006.01)

(56) References Cited

U.S. PATENT DOCUMENTS

| | | | | |
|---|---|---|---|---|
| 6,058,047 | A * | 5/2000 | Kikuchi | 365/185.33 |
| 6,339,546 | B1 * | 1/2002 | Katayama et al. | 365/185.09 |
| 6,480,416 | B2 * | 11/2002 | Katayama et al. | 365/185.09 |
| 6,480,982 | B1 | 11/2002 | Chan et al. | |
| 6,584,015 | B2 * | 6/2003 | Katayama et al. | 365/185.11 |
| 6,751,123 | B2 * | 6/2004 | Katayama et al. | 365/185.09 |
| 7,414,871 | B2 | 8/2008 | Lee et al. | |
| 8,205,146 | B2 * | 6/2012 | Brueggen | 714/799 |
| 2007/0033488 | A1 * | 2/2007 | Brueggen | 714/763 |
| 2009/0055680 | A1 * | 2/2009 | Honda et al. | 714/5 |
| 2011/0029841 | A1 | 2/2011 | Rho | |
| 2011/0055466 | A1 | 3/2011 | Kudo et al. | |

OTHER PUBLICATIONS

Invitation to Pay Additional Fees, and, Where Applicable, Protest Fee and Partial International Search Report mailed May 24, 2013 in International Application No. PCT/US2012/064423, 6 pages.

International Preliminary Report on Patentability for International Application No. PCT/US2012/064423, issued Jun. 10, 2014, 11 pages.

* cited by examiner

US 8,996,936 B2

ENHANCED ERROR CORRECTION IN MEMORY DEVICES

CLAIM OF PRIORITY

The present application claims priority from Patent Application No. 3445/MUM/2011 filed in India on Dec. 8, 2011, which is incorporated herein in its entirety.

FIELD OF THE DISCLOSURE

The present disclosure is generally related to data storage.

BACKGROUND

The capability to store data in memory devices improves with advances in technology. For example, a flash memory device may enable non-volatile storage of data at a semiconductor device that may include one or more memory cores, and each core may be located on a corresponding memory die.

Wear of a memory element of a memory die may occur due to writes, reads, erases, and other memory operations to the memory element. When a memory element experiences excessive wear, it may cease to be a reliable storage element.

Error correction may be applied using error correction codes to stored data and may correct errors that have corrupted the stored data. Error correction consumes time and computing resources. Reducing error correction computing time would result in greater computing efficiency.

SUMMARY

Particular bit positions of memory elements within a nonvolatile memory device may be identified as recurring error bit positions. In response to a request for particular data stored at a portion of a nonvolatile memory, each data bit within the portion that is at a recurring error bit position may be changed, and the particular data including the changed bits may be sent to an error correcting code (ECC) decoder prior to the ECC decoder correcting the data and providing corrected data to a requestor. The recurring error bit positions may be identified by reading each data bit of the portion of the memory a first number of times and comparing each read value of the data bit to a reference value. Bit positions of the data in which the read value differs from the reference value for each of the first number of times are identified as recurring error bit positions. Recurring error bit positions may be identified when data (e.g., an ECC page) is first written to the portion of the nonvolatile memory. The recurring error bit positions may be stored for use when the data is later read from the nonvolatile memory.

DETAILED DESCRIPTION

Figure 1:
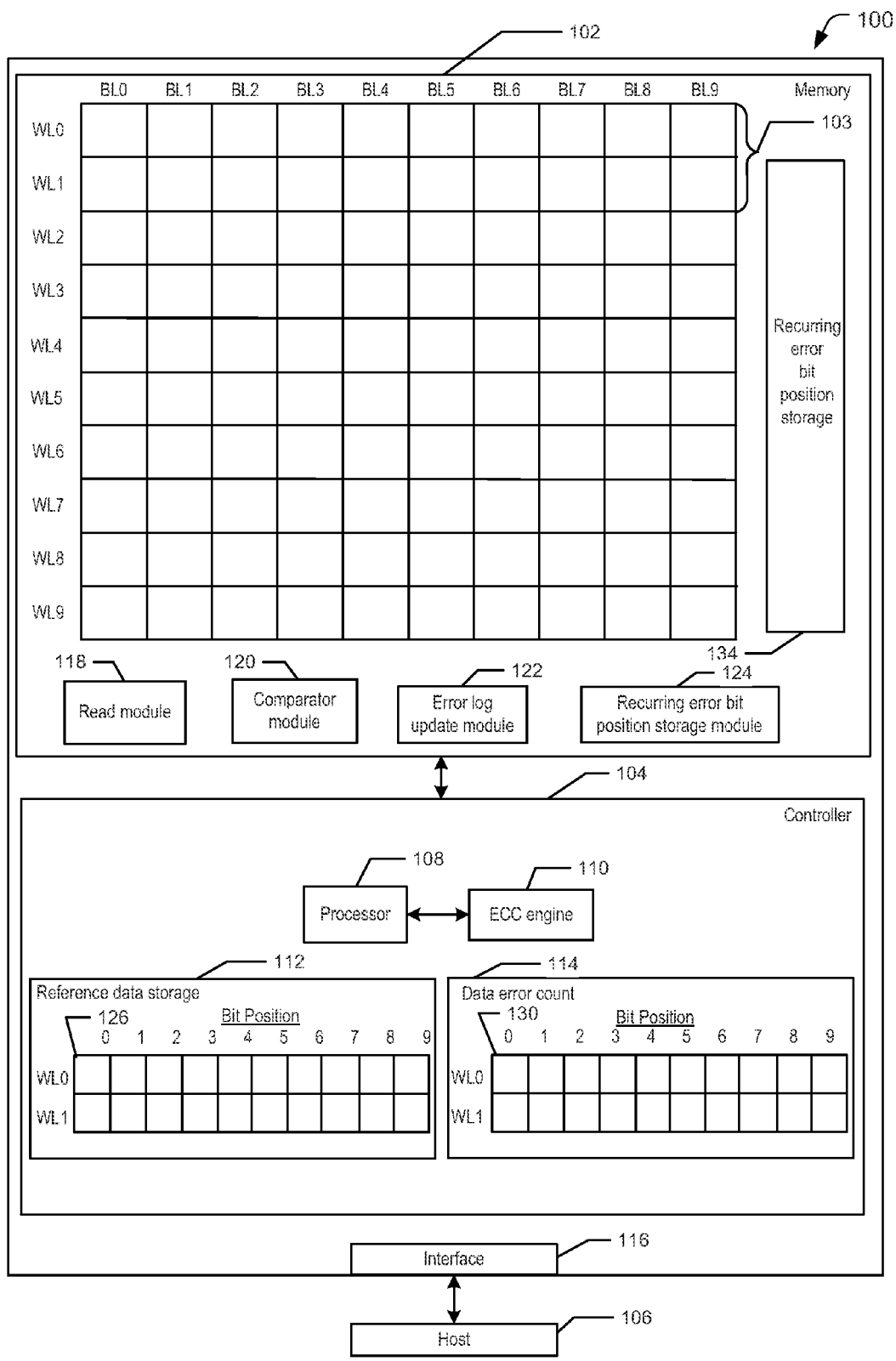
FIG. 1 is a block diagram of a data storage device that is configured to identify recurring error bit positions in a nonvolatile memory.

Data may be stored within a portion (e.g., a page or a block) of a nonvolatile memory. For example, each storage element in the portion of the nonvolatile memory may store one or more bits of the data. When data is written to the portion of the memory and later read from the portion of the nonvolatile memory, one or more bits of the read data may differ from the originally written data. For example, erroneous bits may be caused by defective storage elements in the nonvolatile memory (e.g. due to a faulty electrical connection to a memory cell), by physical effects such as program disturbs or read disturbs that affect data stored in the storage elements but that are not caused by defective storage elements, or by one or more other mechanisms, such as thermal noise or cosmic rays.

A particular bit position may be identified as an error bit position when one or more reads of the corresponding bit value from the nonvolatile memory do not agree with the bit value that was written to nonvolatile memory. The particular bit position may be identified as a recurring error bit position when, for a given number of successive reads, each read value is not in agreement with the value of the data written.

Identifying recurring error bit positions can be advantageous in correcting read errors. For instance, by identifying a first bit position of data stored in a portion of memory (e.g., a first bit position of data stored in a page, a wordline, an error correction code (ECC) page, a block, or another portion of the memory) to be a recurring error bit position, when a stored value of the first bit position is requested, the stored value may be corrected by changing, i.e., flipping, the stored value.

An indicator of each recurring error bit position may be stored in another portion of the memory, or in another memory. In subsequent reads of the data from the memory, error correction may be simplified by updating, i.e., flipping, the stored value corresponding to each recurring error bit position based on the stored indicators.

Flipping a stored value typically involves less computation than error correction by ECC decoding. To illustrate, when a recurring error bit position is identified and data (i.e., bit values) is read from the memory, the bit value corresponding to the recurring error bit position may be presumed to be erroneous. The bit value may be corrected by applying a logical NOT operation to the bit value. However, correcting a bit error using error correction coding may include applying multiple computations to determine a number of errors that exist in the data, generating an error location polynomial based on results of the multiple computations, and computing solutions of the error location polynomial. The computed solutions of the error location polynomial may indicate bit positions of erroneous bits, which may then be corrected.

Error correction of the read data is thus simplified because changing the bit values at recurring bit error positions may correct many or all errors in the data. Any remaining errors may be corrected via ECC decoding at a reduced power consumption and reduced latency as compared to using ECC decoding on the originally read data.

FIG. 1 is an illustration of a particular embodiment of a data storage device 100. The data storage device 100 includes a memory 102. The data storage device 100 also includes a controller 104 and an interface 116. The controller 104 includes a processor 108 and an error correction coding (ECC) engine 110. The controller 104 also includes reference data storage 112 and data error count storage 114. The data storage device 100 is configured to couple to a host 106 via the interface 116.

The data storage device 100 may be included in a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 100 may be embedded memory in a host device, such as an eMMC® (trademark of JEDEC Solid State Technology Association, Arlington, Va.) memory or eSD memory, as illustrative examples.

The memory 102 includes a plurality of storage elements and a recurring error bit position storage 134. The memory 102 may include multilevel cell (MLC) memory elements and may also include single level cell (SLC) memory elements. For example, in a particular embodiment, the memory 102 includes wordlines WL0-WL9 that each include multiple MLC memory elements. Alternatively, the wordlines WL0-WL9 may include SLC memory elements. Bit positions of data stored in one or more of the wordlines WL0-WL9 may correlate to positions of memory elements in the wordlines. For example, in an SLC implementation, each memory element of WL0 may store a single bit of data. To illustrate, a bit value at bit position 0 of the data may be stored at a memory element coupled to WL0 and bitline 0 (BL0), a bit value at bit position 1 of the data may be stored at a memory element coupled to WL0 and BL1, etc. Alternatively, in an MLC implementation, each memory element of WL0 may store multiple bits of the data and therefore may not have the one-to-one correspondence between WL/BL position and bit position as in the SLC example. In a particular embodiment, the recurring error bit position storage 134 may include SLC memory elements. To illustrate, the recurring error bit position storage 134 may be an SLC portion of the memory 102 that is distinct from the wordlines WL0-WL9.

The memory 102 may store a read module 118, a comparator module 120, an error log update module 122, and a recurring error bit position storage module 124. Each of the modules 118, 120, 122, and 124 may include processor executable instructions.

The controller 104 is configured to access the memory 102. The controller 104 may perform a write, a read, another memory operation, or any combination thereof with respect to a particular bit position within the memory 102. The processor 108 may execute the processor executable instructions in any of the modules 118, 120, 122, or 124. For example, when the processor 108 executes the processor executable instructions in the read module 118, one or more bits of data may be read from the memory 102.

In operation, the controller 104 may write data to a portion of the memory 102 that includes one or more wordlines, such as a representative portion 103. For example, the controller 104 may write data to each bit position in the wordlines WL0 and WL1 within the portion 103 of the memory 102. The data written to the wordlines WL0 and WL1 may also be temporarily stored in the reference data storage 112.

After writing the data to the portion 103 of the memory 102, the controller 104 may identify recurring error bit positions to assist with later reads of the data. For example, the recurring error bit positions may be identified as part of a data write operation that is triggered by a write command from the host device 106. As other examples, the recurring error bit positions may be identified as part of a data write during a garbage collection operation, a memory refresh operation, or another memory operation. In response to writing the data to the wordlines WL0 and WL1, the processor 108 may identify recurring error bit positions by comparing data read from WL0 and WL1 (i.e. representations of the data written to WL0 and WL1 that may include one or more errors) to the reference data stored in the reference data storage 112. For example, the controller 104 may command the memory 102 to perform a series of read operations to retrieve bit values from the memory elements of the wordlines WL0 and WL1 for comparison to the data stored in the reference data storage 112.

The processor 108 may compare each bit of the retrieved data representation to a corresponding bit in the reference data storage 112. For example. a bit value at bit position 0 in the read data may be compared to a corresponding bit value 126 stored at bit position 0 in the reference data storage 112. If the bit value at bit position 0 in the data representation is identical to the bit value 126, a bit error count 130 in the data error count storage 114 is not incremented. If the bit value at bit position 0 in the data representation differs from the bit value 126, the bit error count 130 is incremented.

The processor 108 may perform a comparison of values at each of the bit positions of data stored in the wordline 0 and the wordline 1 against corresponding reference bit values stored at the reference data storage 112. Each instance in which the reference value differs from the data representation at the corresponding bit position results in incrementing a corresponding bit error count in the data error count storage 114. The controller 104 may compare each bit value of the data representations to the corresponding reference value stored in the reference data storage 112 and may increment a corresponding bit error count when there is a difference between the stored data representation and the corresponding reference value.

After a comparison has been made for each of the bit positions of the data representations read from the wordlines WL0 and WL1, the controller 104 may read the data representations in the wordlines WL0 and WL1 a second time. After reading the data representations the second time, a comparison may be made between each bit position and the corresponding reference value in the reference data storage 112. A bit error count of each of the bit positions may be maintained at the data error count storage 114. For example, when a difference is determined between a stored data representation at a particular bit position and the corresponding reference value, the corresponding bit error count may be incremented. The processor 108 may update the bit error count in the data error count storage 114, e.g., by executing instructions in the error log update module 122. Reading of the wordlines WL0 and WL1 may be repeated, and the comparisons and the data error count storage 114 updates may be performed after each read. The controller 104 may perform a total of a particular number of reads of the wordlines WL0 and WL1 and subsequent comparisons to the corresponding reference values. For example, the controller 104 may perform a total of 20 reads of the wordlines WL0 and WL1 and may, for each of the 20 reads, compare each read bit value to the corresponding reference value in the reference data storage 112.

After completing the particular number of repetitions, i.e., reads and comparisons, for each of the bit positions, the processor 108, executing instructions in the recurring error bit position storage module 122, compares each error count to the particular number of reads. For example, a total of 20 repetitions, including 20 reads of WL0 and 20 reads of WL1, may be executed by the processor 108. Although 20 repetitions is used as an illustrative example, the particular number of repetitions may instead be, e.g., greater than one repetition, at least 15 repetitions, at least 50 repetitions, or another number of repetitions. When the data error count associated with any particular bit position is equal to the particular number of repetitions (e.g., 20 repetitions), indicating that the particular bit position in consideration has shown an error in the data representation as compared with the reference value after each read and during each repetition, the particular bit position is identified as a recurring error bit position. The processor 108 may store an indicator associated with the particular bit position indicating that the particular bit position is a recurring error bit position. The indicator may be stored in the recurring error bit position storage 134. The recurring error bit position storage 134 may be in an SLC portion of the memory 102 to provide a greater likelihood of maintaining accuracy over a long period of time as compared with storage of the recurring error bit indicators in an MLC portion of the memory 102.

In addition to writing data to the portion 103 of the memory 102, the controller 104 may also write data to other portions of the memory 102. For example, a portion can include a single wordline, such as WL6, two wordlines, such as the wordlines WL2 and WL3, or more than two wordlines, as illustrative, non-limiting examples. At each instance of a write of data to the memory 102, the controller 104 may additionally store the data at the reference data storage 112. Thus, the reference data storage 112 may serve as temporary storage of data being written to the memory 102 and may provide the reference value for comparison to a data representation that is read back from the memory 102.

For example, each time a write to a portion of the memory 102 occurs, the data error count storage 114 may be initialized, e.g., all data error counts may be reset to 0. As part of a data write operation, after the data has been written to the portion of the memory 102, the data may be read from the portion of the memory 102 and the controller 104 may execute a comparison between bit values in the read data and bit values stored in the reference data storage 112. A bit error count corresponding to each bit position may be maintained at the data error count storage 114 and the processor 108 may update the bit error count each time a difference is determined between the bit value of the read data at a particular bit position and the corresponding reference value stored at the reference data storage 112. After a predetermined number of reads and comparisons are made, the recurring error bit position storage 134 may be updated by including an indicator corresponding to each bit position identified to be a recurring error bit position.

Thus, when data is written to the memory 102, the stored data may be tested (e.g. repeatedly read and compared to a reference value) to determine which bit positions are recurring error bit positions, and an indicator of each recurring error bit position may be stored at the recurring error bit position storage 134. For example, data written to each portion of the memory 102 may be tested upon each occurrence of writing the data to the portion.

In addition to determining recurring bit error positions as part of a data write operation to the memory 102, in another implementation recurring bit error positions may be determined as part of testing the entire memory 102. For example, test data may be written to each portion of the memory 102 and recurring error bit positions in the test data read from each portion may be identified. Subsequent writes to a particular portion of the memory 102 may be made, and subsequent reads after the writes may be at least partially corrected based on the indicators stored at the recurring error bit position storage 134. In a testing implementation, larger portions of the memory, such as blocks or groups of blocks, may be used to determine recurring bit error positions.

Identified recurring bit error positions may be used to at least partially correct data read from the memory 102. For example, in response to a read request for particular data stored in a portion of the memory 102, such as data stored in wordlines WL0 and WL1, the expected errors in each recurring error bit position may be corrected and the requested data may be sent to the ECC engine 110 to be decoded. The ECC engine 110 may detect and correct additional errors within the portion of the memory 102 storing the requested data. By correcting each recurring error bit position prior to sending retrieved data to the ECC engine 110, a more efficient use of the ECC engine 110 may result, since the ECC engine 110 may have fewer errors to detect and correct in the resulting data.

Figure 2:
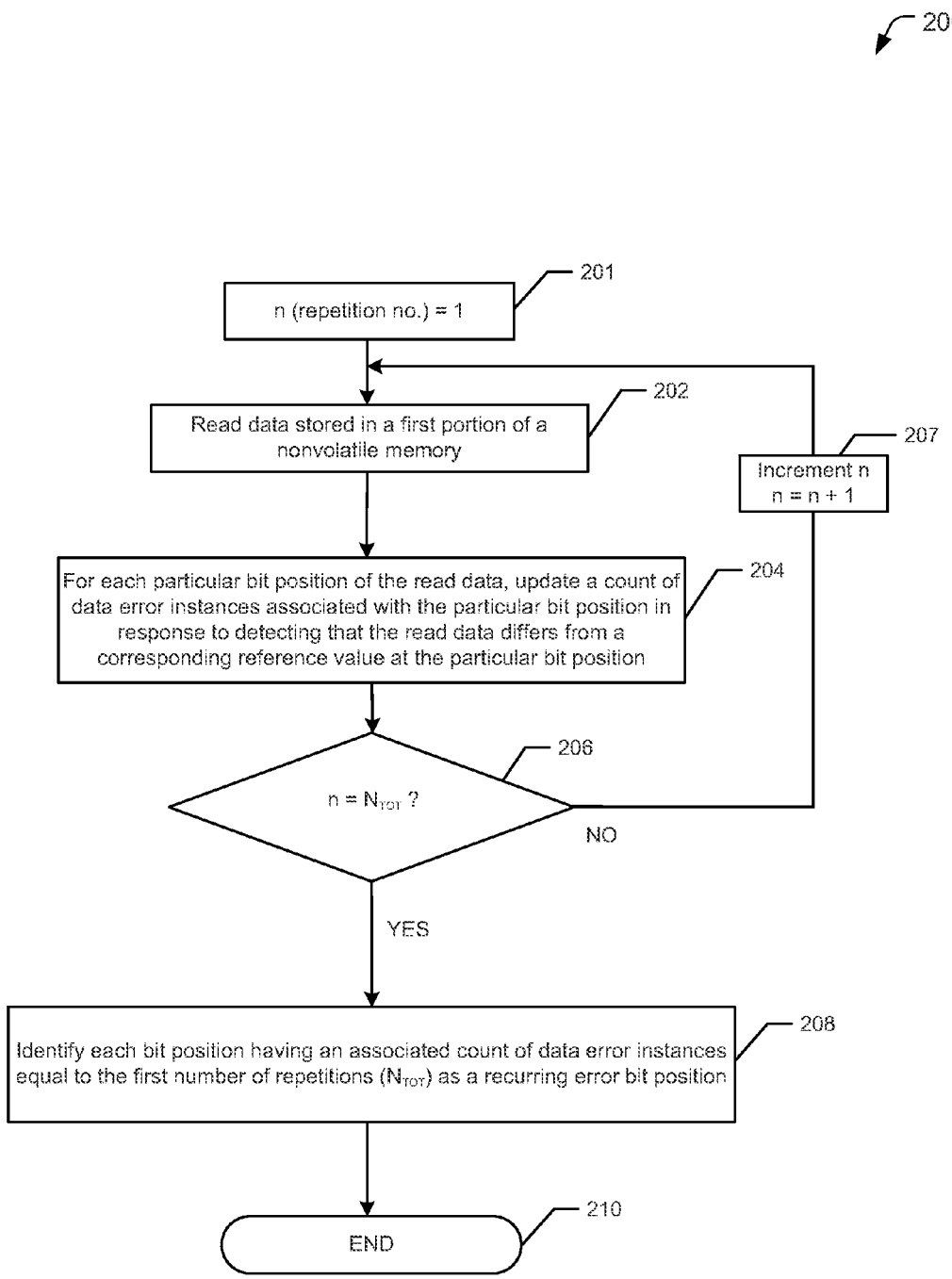
FIG. 2 is a flow chart of a particular embodiment of a method of identifying recurring error bit positions in a data storage device.

FIG. 2 is an illustration of a particular embodiment of a method of correcting stored data that may be performed in the controller 104 of the data storage device 100 of FIG. 1. Referring to FIG. 2, a repetition number n is initialized to a value of 1, at 201. Data stored in a first portion of a nonvolatile memory is read, at 202. For example, the data stored in WL0 and WL1 of the memory 102 of FIG. 1 may be read. For each particular bit position of the read data, a count of bit error instances associated with the particular bit position may be updated (i.e., incremented) in response to detecting that a read bit value differs from a corresponding reference value of the particular bit position, at 204. For example, in response to detecting that a bit value at bit position 0 that is read from the memory 102 of FIG. 1 differs from the reference value 126, the bit error count 130 may be incremented. If the repetition number n is not equal to a particular number of repetitions $N_{TOT}$, (e.g., 15 repetitions, 20 repetitions, 50 repetitions, or another number of repetitions) at 206, n is incremented, at 207, and data stored in the first portion of the nonvolatile memory is read again, at 202.

If the repetition number n is equal to $N_{TOT}$ (i.e., all repetitions are complete), at 206, advancing to 208, each bit position having an associated count of data error instances that is equal to the particular number of repetitions $N_{TOT}$ is identified as a recurring error bit position. For example, in FIG. 1, if the value stored in the bit error count 130 is equal to $N_{TOT}$, then bit position 0 is identified as a recurring error bit position. An indication that bit position 0 is a recurring error bit position in the read data may be stored in the recurring error bit position storage 134. The method ends at 210.

By determining which bit positions are recurring error bit positions, bit values corresponding to the recurring error positions may be corrected upon later reading the data. A significant portion of errors occurring in the data may therefore be corrected prior to providing the data to an ECC decoder. As a result, ECC decoding of the partially corrected data may be consume less power and may complete more quickly as compared to ECC decoding of the data originally read from the memory.

Figure 3:
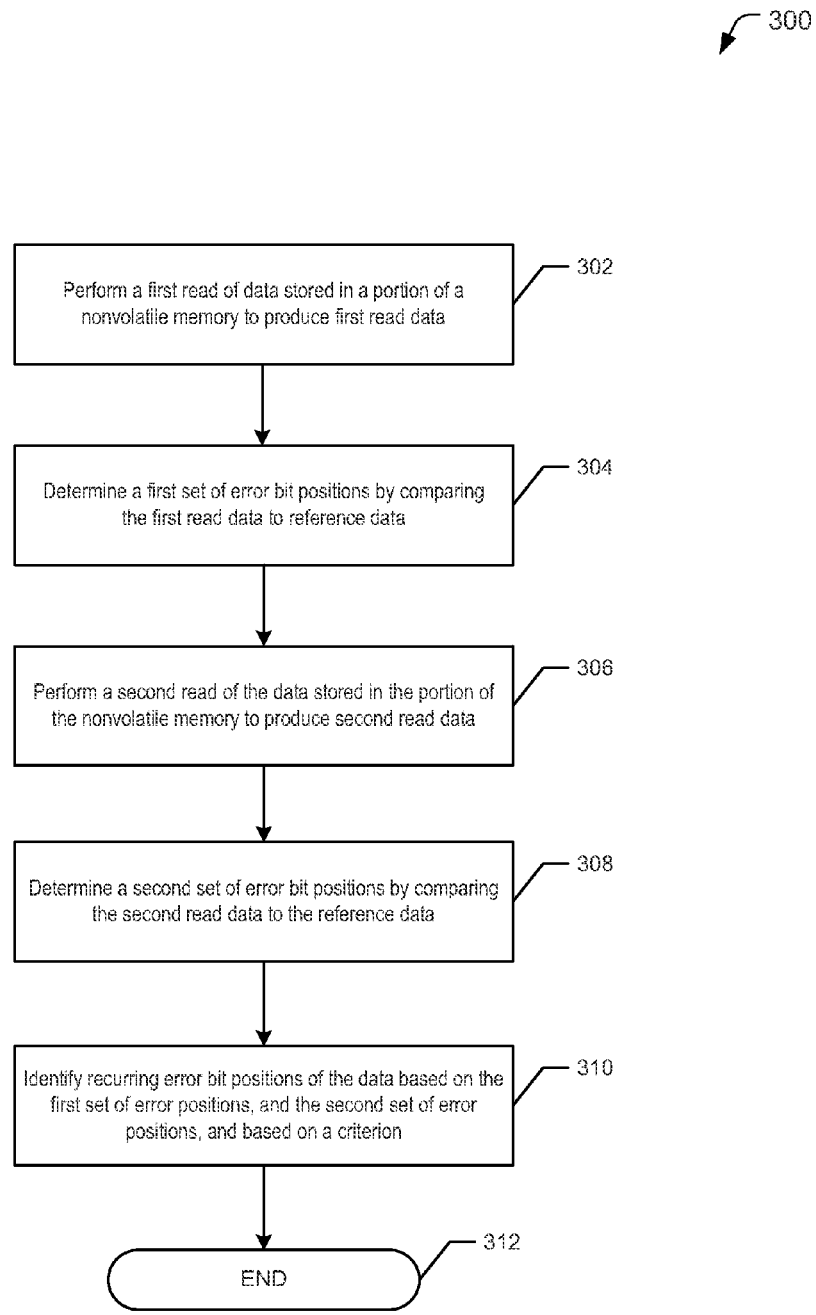
FIG. 3 is a flow chart of another embodiment of a method of identifying recurring error bit positions in a data storage device.

FIG. 3 is a particular embodiment of a method of storing data at a data storage device, such as the data storage device 100 of FIG. 1. A first read of data stored in a portion of a nonvolatile memory is performed to produce first read data, at 302. For example, the first read data may be read from WL0 of the memory 102 and provided to the controller 104 of FIG. 1.

A first set of error bit positions may be determined by comparing the first read data to reference data, at 304. For example, the first read data may be compared to data stored at the reference data storage 112 of FIG. 1 and a first set of error bit positions may be identified as bit positions where the first read data does not match the data stored at the reference data storage 112.

A second read of the data stored in the portion of the nonvolatile memory may be performed to produce second read data, at 306. For example, the second read data may be read from WL0 of the memory 102 and provided to the controller 104 of FIG. 1. A second set of error bit positions may be determined by comparing the second read data to the reference data, at 308. For example, the second read data may be compared to data stored at the reference data storage 112 of FIG. 1 and a second set of error bit positions may be identified as bit positions where the second read data does not match the data stored at the reference data storage 112.

Recurring error bit positions of the data are identified from the first set of error positions and from the second set of error positions based on a criterion, at 310. For example, the criterion may specify that each particular bit position included in the first set of error bit positions and in the second set of error bit positions is identified as a recurring error bit position.

In another example, multiple reads of the data, including the first read and the second read, are performed to produce a plurality of read data. For each read data, a corresponding set of error bit positions is determined by comparing the read data to the reference data. The criterion may identify a particular bit position as a recurring error bit position conditioned on satisfying a threshold criterion that specifies a particular ratio of a count of instances of inclusion of the particular bit position in the sets of error bit positions to a total count of reads. To illustrate, the threshold criterion may indicate that, if a bit position is an error bit position in 18/20 sets of error positions (i.e. 20 reads are performed to generate 20 sets of error positions, and a same bit position appears in at least 18 of the 20 sets of error positions), the bit position may be identified as a recurring error bit position. The threshold ratio may be determined based on calculations, simulations, experimental results, or any combination thereof, to determine a threshold ratio that provides an overall enhanced error correction by identifying recurring error bit positions in view of possible misidentifications of recurring error bit positions and a cost of storing recurring error bit position indicators. In some embodiments, the threshold ratio may equal one (e.g., 20/20). In other embodiments, the threshold ratio may be less than one.

Figure 4:
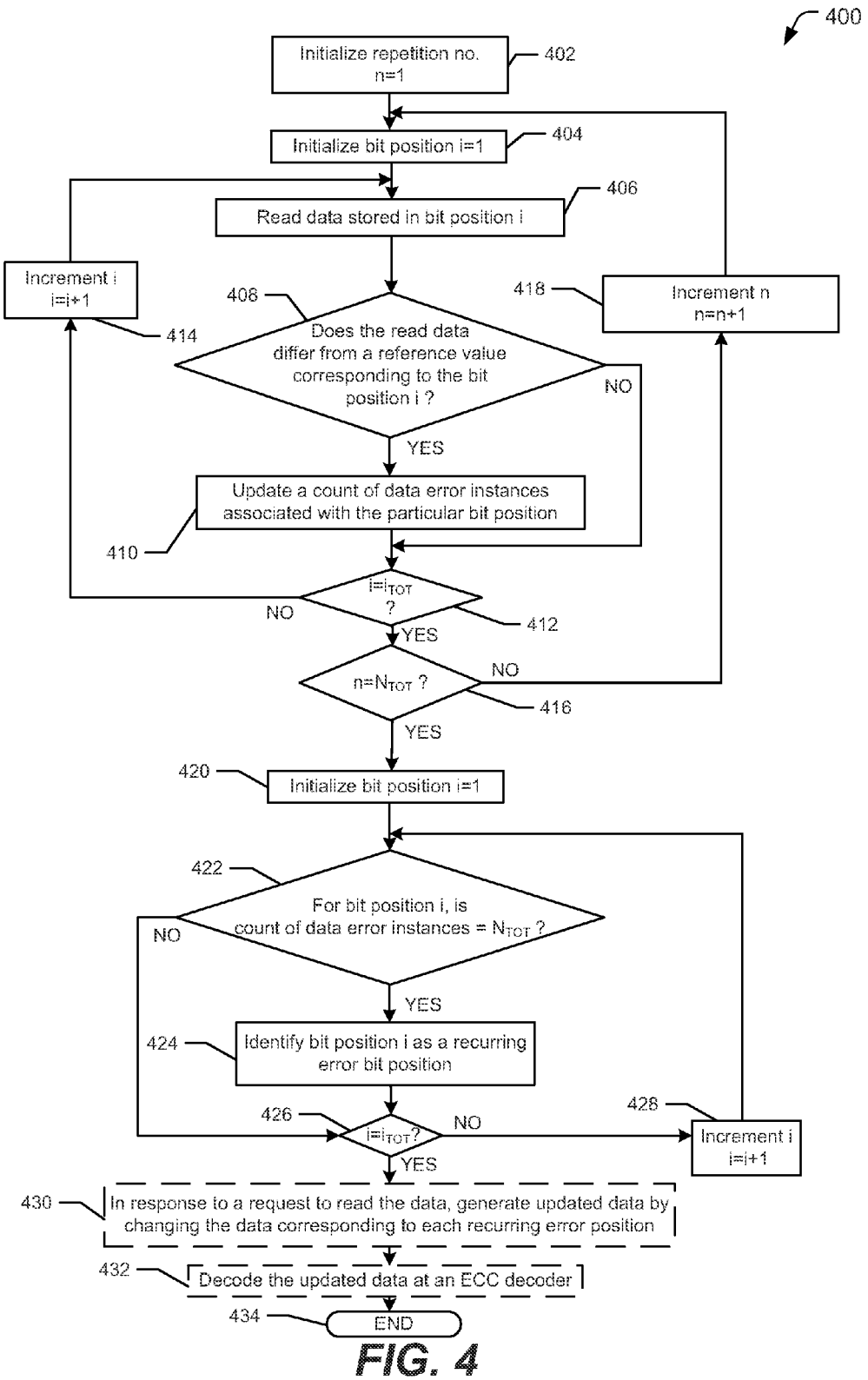
FIG. 4 is a flow chart of another embodiment of a method of identifying recurring error bit positions in a data storage device.

FIG. 4 is a particular embodiment of a method of storing data at a data storage device, such as the data storage device 100 of FIG. 1. For example, the method may be performed by the controller 104 in conjunction with storing data in the memory 102 of FIG. 1. A repetition number n is initialized to n=1, at 402. An integer index i, referencing a bit position, is initialized to a value of 1, at 404. Data stored in bit position i is read, at 406. For example, in FIG. 1, the controller 104, executing instructions in the read module 118, may read the data in bit position 0 (e.g. a data bit stored in a storage element at WL0/BL0 of the memory 102). As an example, the controller 104 may read the data corresponding to bit position 0 by retrieving from the memory 102 one or more pages of data read from WL0 and parsing the read data to identify a bit value corresponding to bit position 0 of the read data.

A comparison is made of the read bit value to a reference value that corresponds to bit position i, at 408. For example, the controller 104, executing instructions in the comparator module 120, may compare the bit value in bit position 0 to the reference value 126 stored in the reference data storage 112. If the read bit value differs from the corresponding reference value, a count of bit error instances associated with the particular bit position i is updated, i.e., incremented, at 410. For example, if the read bit value corresponding to bit position 0 differs from the reference value 126, the value stored in the bit error count 130 is incremented. If the read bit value does not differ from the reference data, at 408, the count of bit error instances is not incremented.

A determination is made whether all bit positions have been considered (i.e., $i=i_{TOT}$, where $i_{TOT}$ is a total number of bit positions), at 412. If $i<i_{TOT}$, the index i is incremented, at 414, and the data in the next sequential bit position i is read, at 406. Otherwise, if $i=i_{TOT}$, i.e., all bit positions i within the portion of the memory have been compared to a corresponding reference value, a determination is made whether the repetition number n is equal to a total number of repetitions $N_{TOT}$, at 416. If the total number of repetitions $N_{TOT}$ has not been satisfied (i.e., $N \neq N_{TOT}$), N is incremented, at 418, the bit position index i is initialized, at 404, and the read of each bit position and comparison to the corresponding reference value are repeated.

Returning to 416, if the total number of repetitions $N_{TOT}$ has been satisfied ($N=N_{TOT}$), the bit position i is initialized, at 420. At each position i, the count of bit error instances is compared to $N_{TOT}$, at 422. For a particular position i, if the count of bit error instances is equal to $N_{TOT}$, the particular bit position i is identified as a recurring error bit position, at 424. For example, in FIG. 1, by comparing the data error count 130 associated with the bit value at bit position 0 to a particular number of repetitions, bit position 0 may be identified as a recurring error bit position and an indicator associated with bit position 0 may be stored in the recurring error bit position storage 134. Proceeding to 426, a determination is made whether all bit positions i have been considered to determine whether they are recurring error bit positions, at 426. The method evaluates whether i is equal to $i_{TOT}$, at 426. If not all of the bit positions i have been considered, the index i is incremented, at 428, and returning to 422, a determination is made, for the next sequential bit position i, as to whether the corresponding count of bit error instances is equal to $N_{TOT}$. Otherwise, if the count of bit error instances is equal to $N_{TOT}$, the bit position i is identified as a recurring error bit position, at 424.

If the count of data error instances is not equal to $N_{TOT}$ for the bit position i, at 422, the bit position i is not a recurring error bit position and, proceeding to 426, a determination is made as to whether all values of i have been considered. If not all values of i have been considered as to whether they are recurring error bit positions, the index i is incremented, at 428, and the next sequential bit position is tested as to whether the associated count of bit error instances is equal to $N_{TOT}$, at 422.

In a particular embodiment, after identifying each recurring error bit position, in response to a request to read the data, updated data may be generated by changing, i.e., flipping, the bit value corresponding to each recurring error bit position, at 430. Flipping the bit values corresponding to each recurring error bit position may reduce subsequent error correction, such as in an ECC decoder, because the stored values corresponding to the identified recurring error bit positions are corrected prior to ECC decoding. The updated data may be decoded at an ECC decoder, at 432. The method ends at 434.

Figure 5:
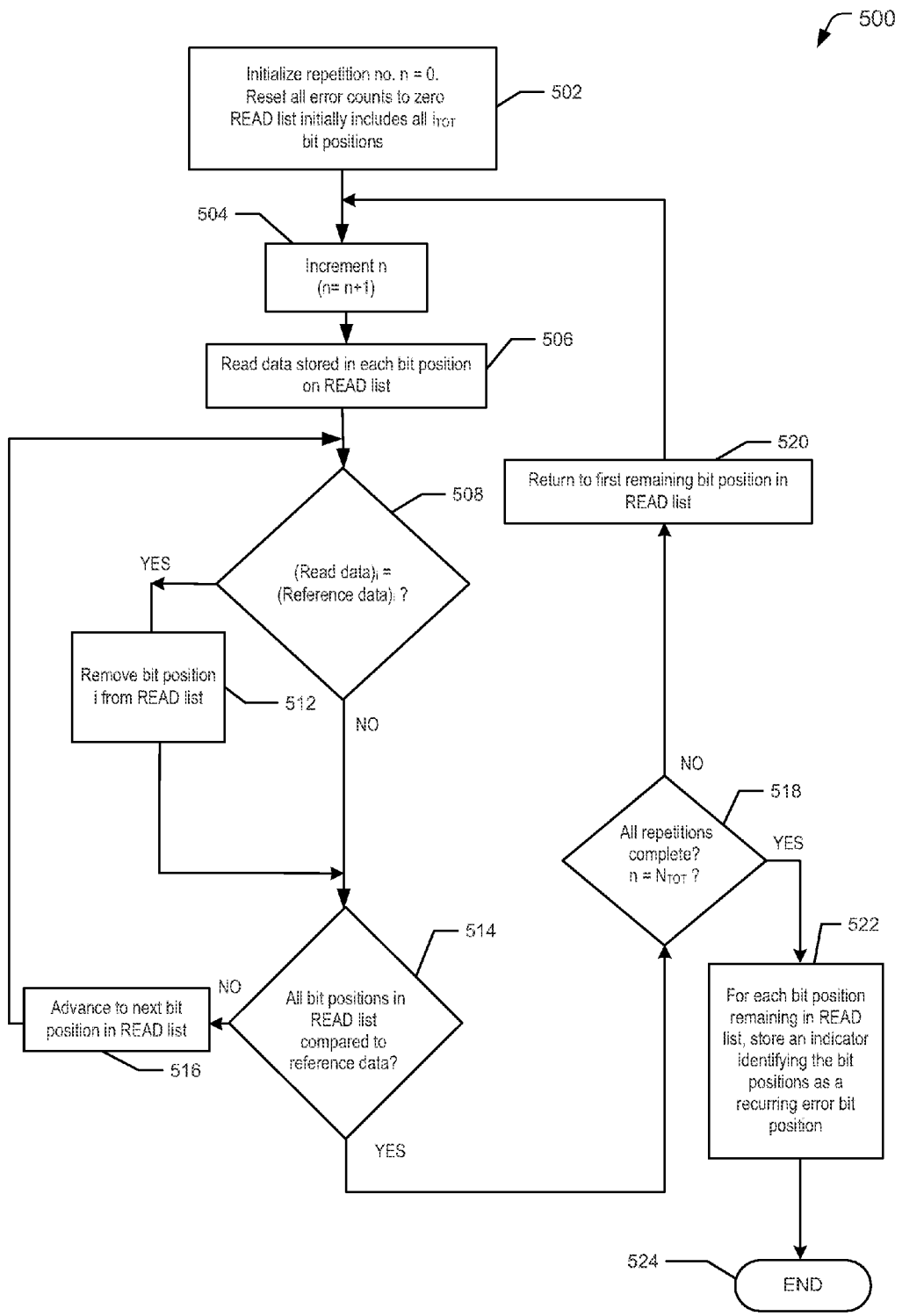
FIG. 5 is a flow chart of another embodiment of a method of identifying recurring error bit positions in a data storage device.

FIG. 5 illustrates a particular embodiment of a method of storing data at a data storage device, such as the data storage device 100 of FIG. 1, and determining recurring error bit positions using a reduced total number of reads and comparisons as compared with the method of FIG. 4. A repetition number n is initialized to 0, at 502. Additionally, all error counts are reset to 0. A READ list initially includes all bit positions, $i_{TOT}$, at 502. For example, the controller 104 of FIG. 1 may initiate and maintain the READ list by initially populating a list (e.g. a singly-linked list) to indicate all bit positions of data to be read from a portion of the memory 102. Although described as a list, in other implementations another data structure, such as an array or a bitstring, may instead be used.

The repetition number n is incremented, at 504. Data in each bit position on the READ list is read, at 506. The read bit value for a particular bit position i is compared to a corresponding reference data, at 508. For example, in FIG. 1, the read bit value for bit position 0 may be compared with the corresponding reference value 126. If the read bit value is equal to the reference value, the bit position i is removed from the READ list, at 512. Thus, any comparison in which the read bit value is equal to the corresponding reference value results in the particular bit position being eliminated from the READ list, i.e., the list of possible recurring error bit positions, and the particular bit position is not tested in subsequent repetitions.

If the read bit value for bit position i is not equal to the corresponding reference value, the method evaluates whether all bit positions in the READ list have been compared to corresponding reference values for the $n^{th}$ repetition, at 514. If additional bit positions in the READ list have not yet been compared to their corresponding reference values, the method advances to the next bit position appearing in the READ list, at 516, and returns to 508.

A determination is made whether all repetitions have been completed, at 510. If additional repetitions are to be completed before all repetitions are complete (i.e., $n \neq N_{TOT}$), returning to the first remaining bit position in the READ list, at 520, the method then returns to 504 and increments the repetition counter n. Each bit position remaining on the READ list is considered by reading the stored data representation and comparing the read value to the corresponding reference value.

After all reads have been completed, i.e. $n=N_{TOT}$, each remaining bit position on the READ list is identified as a recurring error bit position. Indicators of the identified recurring error bit positions are stored, at 522. The indicators may be stored, e.g., in the recurring error bit position storage 134 of FIG. 1.

Removing each bit position from the READ list for which the read value is equal to the reference value may reduce a total number of reads and comparisons as compared with the method of FIG. 4. A particular bit position is identified as a recurring error bit position in response to every instance of read value differing from the corresponding reference value. By removing a bit position having an instance in which the read value is equal to the reference value from the READ list, the number of subsequent reads and comparisons of remaining READ list entries may be reduced as compared with the method of FIG. 4. Reducing reads and comparisons can reduce processing usage, resulting in more efficient use of the controller.

Although various components depicted herein are illustrated as block components and described in general terms, such components may include one or more microprocessors, state machines, or other circuits configured to enable the data storage device 100 of FIG. 1, to perform the particular functions attributed to such components or any combination thereof. For example, the controller 104 of FIG. 1 may include a physical component such as a hardware controller, a state machine, a logic circuit, or another structure to manage wear leveling in a data storage device and to transfer data from a memory die to another memory die of a memory stack.

Alternatively, or in addition, the data storage device 100 of FIG. 1 may include executable instructions that may be executed by the controller 104 to implement one or more functions of reading, comparing, updating, and storing. The instructions may be stored in nonvolatile memory such as the memory 102, or in a random access memory. For example, the instructions may be within one or more of the read module 118, the comparator module 120, the error log update module 112, and the recurring error bit position storage module 124, each of which may be stored in the memory 102 of FIG. 1. Alternatively, or in addition, executable instructions that are executed by the controller may be stored at a separate memory that is not part of memory 102, such as at a read-only memory (ROM).

The data storage device 100 may be included in a portable device configured to be selectively coupled to one or more external devices. The data storage device 100 may be removable, such as a Universal Serial Bus (USB) drive or a memory card. Alternatively, the data storage device 100 may be attached or embedded within one or more host devices, such as within a housing of a portable communication device. For example, the data storage device 100 may be within a packaged apparatus such as a wireless telephone, a personal digital assistant (PDA), a gaming device or console, a portable navigation device, a computer device, or other device that uses internal non-volatile memory. The data storage device 100 may include a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of non-volatile memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

What is claimed is:

1. A method comprising:
repeatedly reading and checking data stored in a portion of a nonvolatile memory, wherein the data is stored in memory elements located at a plurality of bit positions in the portion of the nonvolatile memory, wherein repeatedly reading and checking the data includes performing a particular number of repetitions of:
reading a bit value of a bit position;
comparing the read bit value to a reference value of the bit position to determine whether the read bit value is different from the reference value; and
updating a count of data error instances associated with the bit position in response to detecting that the read bit value differs from the reference value of the bit position;
and
identifying each particular bit position having an associated count of data error instances equal to the particular number of repetitions as a recurring error bit position.

2. The method of claim 1, further comprising storing an indicator of each of the recurring error bit positions in the nonvolatile memory.

3. The method of claim 2, wherein each of the indicators is stored in a single level cell (SLC) portion of the nonvolatile memory, the SLC portion distinct from the portion.

4. The method of claim 1, wherein each bit of the data is read from a distinct memory element of the portion and wherein each distinct memory element of the portion is a multi-level cell (MLC) element.

5. The method of claim 1, wherein the nonvolatile memory is a flash memory.

6. The method of claim 1, wherein the nonvolatile memory is a NAND flash memory.

7. The method of claim 1, wherein the recurring error bit positions are identified in response to writing reference data to the portion of the nonvolatile memory.

8. The method of claim 7, wherein the reference data is written to the portion in response to receiving a request to store the reference data.

9. The method of claim 1, the method further comprising, in response to receiving a request to read the data, generating updated data by changing the bit value at each recurring error bit position.

10. The method of claim 9, further comprising decoding the updated data at an error correction coding (ECC) decoder.

11. The method of claim 1, wherein the particular number of repetitions is at least fifteen.

12. The method of claim 1, wherein the particular number of repetitions is at least fifty.

13. A data storage device comprising:
a nonvolatile memory including a portion that includes a plurality of bit positions; and
a controller, the controller configured to, after performing a write operation to write data to the portion of the nonvolatile memory:
perform a particular number of repetitions of:
read the data from the portion;
check the read data for errors by comparing the read data to reference data; and
update a count of data error instances associated with each particular bit position in response to detecting that a bit value in the read data at the particular bit position differs from a corresponding reference value in the reference data at the particular bit position; and
identify each bit position having an associated count of data error instances equal to the particular number of repetitions as a recurring error bit position.

14. The data storage device of claim 13, wherein the controller is further configured to store an indicator of each recurring error bit position, each indicator identifying the corresponding bit position.

15. The data storage device of claim 14, wherein each indicator is stored in a single level cell (SLC) portion of the nonvolatile memory.

16. The data storage device of claim 13, wherein each bit value is read from a distinct memory element of the portion and wherein each distinct memory element is a multi-level cell (MLC) element.

17. The data storage device of claim 13, wherein the recurring error bit positions are identified in response to writing reference data to the portion.

18. The data storage device of claim 13, wherein the controller is further configured to read multiple bit values in response to receiving a request to read the data.

19. The data storage device of claim 18, wherein in response to receiving the request to read the data, the controller is further configured to generate updated data by changing the bit value at each recurring error bit position, the updated data including each changed bit value.

20. The data storage device of claim 19, wherein the controller is further configured to transfer the updated data including each value of each bit position to an error correction coding (ECC) decoder.

21. The data storage device of claim 13, wherein the nonvolatile memory is a NAND flash memory.

22. A method comprising:
performing a first read of data stored in a portion of a nonvolatile memory to produce first read data;
determining a first set of error bit positions by comparing the first read data to reference data;
performing a second read of the data stored in the portion of the nonvolatile memory to produce second read data;
determining a second set of error bit positions by comparing the second read data to the reference data; and
identifying recurring error bit positions from the first set of error positions and from the second set of error positions based on a criterion.

23. The method of claim 22, wherein the criterion specifies that each particular bit position identified as a recurring error bit position is conditioned on the particular bit position being included in the first set of error bit positions and in the second set of error bit positions.

24. The method of claim 22, further comprising:
performing multiple reads of the data, including the first read and the second read, to produce a plurality of read data;
for each read data, determining a corresponding set of error bit positions by comparing the read data to the reference data; and
wherein the criterion identifies a particular bit position as a recurring error bit position conditioned on satisfying a threshold criterion that specifies a particular ratio of a count of instances of inclusion of the particular bit position in the sets of error bit positions to a total count of reads.

25. A method of handling data in a data storage system comprising:
determining whether a bit location in the data storage system has a recurring error bit stored therein, wherein determining the bit location as having a recurring error bit location includes alternatingly writing a bit into the bit location a number of times, the bit being a reference bit, and reading the bit from the bit location the number of times, wherein each time the bit is read from the bit location, the read bit is compared to the reference bit to determine whether the read bit is different from the reference bit; and
identifying the bit location as a recurring error bit location when it is determined that the bit location has a recurring error bit stored therein, wherein when reading data from the data storage system that includes a bit stored in the recurring error bit location, the bit is corrected prior to processing the data.

26. The method of claim 25, wherein processing the data includes providing the data to an error correcting code (ECC) system to locate and correct errors in the data.

27. The method of claim 25, wherein the bit location is identified as the recurring error bit location when the bit is different from the reference bit a plurality of times.

28. The method of claim 27, wherein the plurality of times is equal to the number of times.

29. The method of claim 27, wherein the bit is part of data that is to be stored at a location in the data storage system and the bit location is within the location where the data is to be stored into the data storage system.

30. The method of claim 25, wherein identifying the bit location as a recurring error bit location includes storing the bit location at a memory location of the data storage system.

31. The method of claim 30, wherein the bit location is in a multi-bit memory element of the data storage system and the memory location corresponds to a single-bit memory element of the data storage system.

* * * * *